(12) United States Patent
Chen et al.

(10) Patent No.: US 10,165,664 B1
(45) Date of Patent: Dec. 25, 2018

(54) APPARATUS FOR DECONTAMINATING WINDOWS OF AN EUV SOURCE MODULE

(71) Applicant: Taiwan Semiconductor Manufacturing Co., Ltd., Hsinchu (TW)

(72) Inventors: Hsin-Feng Chen, Yilan (TW); Bo-Tsun Liu, Taipei (TW); Li-Jui Chen, Hsinchu (TW); Han-Lung Chang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/882,733

(22) Filed: Jan. 29, 2018

Related U.S. Application Data

(60) Provisional application No. 62/588,999, filed on Nov. 21, 2017.

(51) Int. Cl.
*G03F 7/20* (2006.01)
*H05G 2/00* (2006.01)

(52) U.S. Cl.
CPC ......... *H05G 2/005* (2013.01); *G03F 7/70033* (2013.01); *G03F 7/70041* (2013.01); *G03F 7/70533* (2013.01); *G03F 7/70916* (2013.01); *H05G 2/00* (2013.01); *H05G 2/001* (2013.01); *H05G 2/008* (2013.01)

(58) Field of Classification Search
CPC ............. G03F 7/70033; G03F 7/70041; G03F 7/70916; H05G 2/00; H05G 2/001; H05G 2/005; H05G 2/008
See application file for complete search history.

(56) References Cited

U.S. PATENT DOCUMENTS

| | | | |
|---|---|---|---|
| 7,196,342 B2 | 3/2007 | Ershov et al. | |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 4/2015 | Huang et al. | |
| 9,184,054 B1 | 11/2015 | Huang et al. | |
| 9,256,123 B2 | 2/2016 | Shih et al. | |
| 9,516,730 B2 * | 12/2016 | Fleurov | H05G 2/008 |
| 9,529,268 B2 | 12/2016 | Chang et al. | |
| 9,548,303 B2 | 1/2017 | Lee et al. | |
| 9,678,431 B2 | 6/2017 | Lu et al. | |
| 9,857,679 B2 | 1/2018 | Hsu et al. | |
| 2005/0178979 A1 * | 8/2005 | Masaki | G03F 7/70916 250/492.1 |

(Continued)

*Primary Examiner* — Michelle M Iacoletti

(74) *Attorney, Agent, or Firm* — Haynes and Boone, LLP

(57) ABSTRACT

An apparatus, and a method of using the same, for monitoring and removing tin contamination on windows of an extreme ultraviolet lithography (EUVL) radiation source vessel includes an optical sensing module embedded in one or more monitoring units for inspecting the EUV radiation source. The optical sensing module measures intensity of infrared (IR) radiation. The apparatus further includes heating elements, hydrogen gas supply module, and a gas removal module for removing the tin contamination when the intensity of the IR radiation falls below a threshold of a baseline intensity corresponding to a substantially uncontaminated window.

20 Claims, 6 Drawing Sheets

(56) References Cited

U.S. PATENT DOCUMENTS

| | | | |
|---|---|---|---|
| 2005/0205810 A1* | 9/2005 | Akins | B82Y 10/00 250/504 R |
| 2014/0017604 A1 | 1/2014 | Lee et al. | |
| 2015/0104745 A1 | 4/2015 | Huang et al. | |
| 2017/0277040 A1 | 9/2017 | Lu et al. | |

* cited by examiner

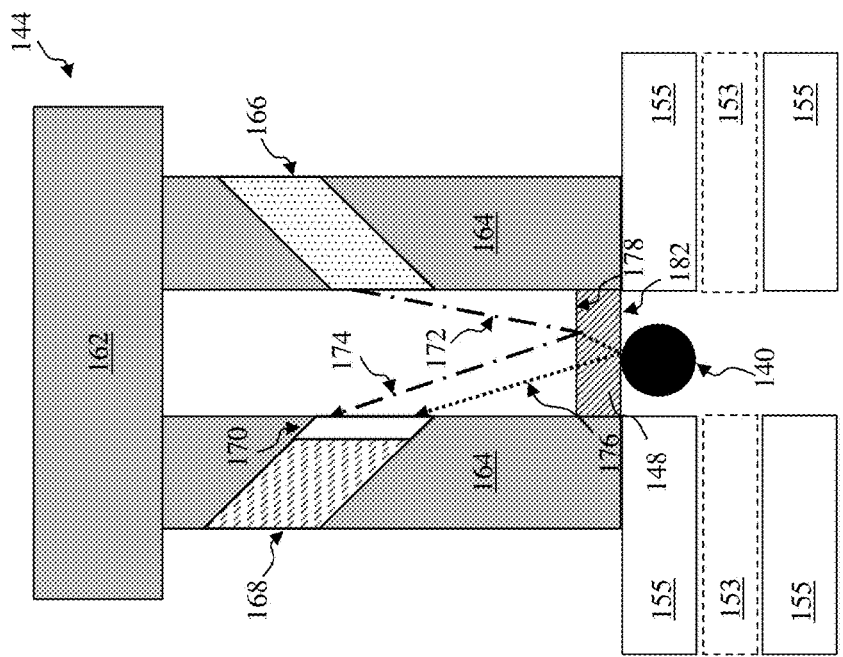
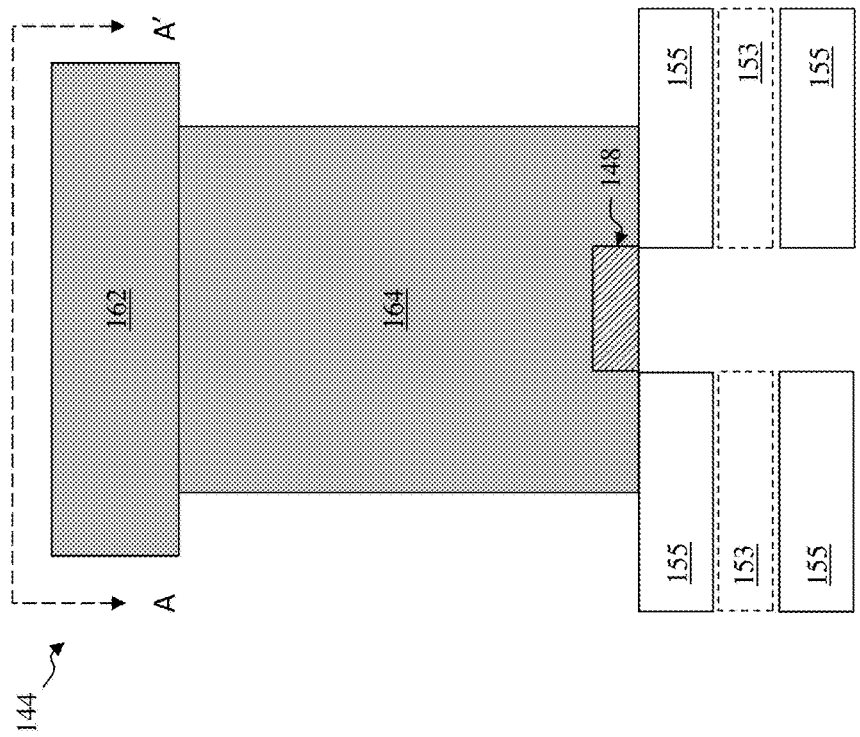

APPARATUS FOR DECONTAMINATING WINDOWS OF AN EUV SOURCE MODULE

PRIORITY DATA

This application claims priority to U.S. Provisional Patent Application Ser. No. 62/588,999, entitled "Apparatus for Decontaminating Windows of an EUV Source Module," filed Nov. 21, 2017, the entire disclosure of which is hereby incorporated.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, extreme ultraviolet lithography (EUVL) has become an important technique for implementing high-resolution lithography processes. While existing EUVL apparatuses and methods have been generally adequate, they have not been entirely satisfactory in every aspect. In one example, an EUV target material can contaminate components of a source vessel during a lithography exposure process, thereby shortening the lifetime of the components and necessitating maintenance procedures that require interruption of the lithography exposure process. Thus, improvements in this aspect are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 illustrates a portion of the EUV radiation source module of FIG. 3 in accordance with various aspects of the present disclosure.

FIG. 5 illustrates a cross-sectional view of the portion of the EUV radiation source module of FIG. 4 taken along line AA' in accordance with various aspects of the present disclosure.

DETAILED DESCRIPTION

Figure 1:
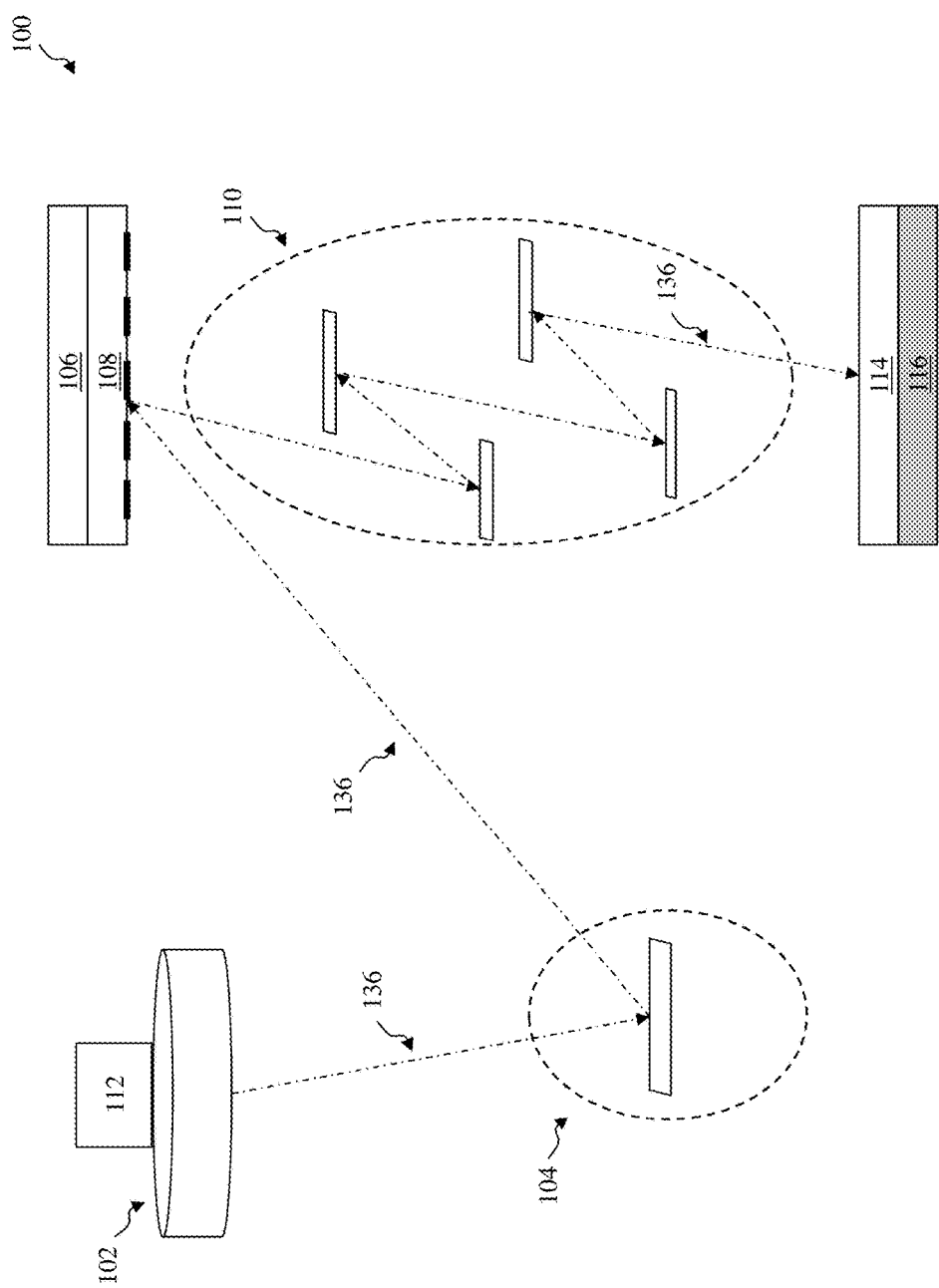
FIG. 1 is a schematic view of an exemplary lithography system in accordance with various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure is generally related to an extreme ultraviolet lithography (EUVL) system and method of using the same. The terms lithography, immersion lithography, photolithography and optical lithography may be used interchangeably in the present disclosure. Photolithography is a process used in micro-fabrication, such as semiconductor fabrication, to selectively remove parts of a substrate or a material layer deposited thereon. The process uses light to transfer a pattern on a mask (or "photomask") to a light-sensitive layer (e.g., a photoresist layer) on the substrate. The light causes a chemical change in exposed regions of the light-sensitive layer, which may increase or decrease solubility of the exposed regions with respect to a developing solution. If the exposed regions become more soluble, the light-sensitive layer is referred to as a positive-tone photoresist. If the exposed regions become less soluble, the light-sensitive layer is referred to as a negative-tone photoresist. Baking processes may be performed before or after exposing the substrate, such as a post-exposure baking process. A developing process selectively removes the exposed or unexposed regions with a developing solution, thereby creating a latent pattern over the substrate. A series of chemical treatments may then etch the latent pattern into the substrate (or the material layer deposited thereon) using the photoresist layer as an etch mask. Alternatively, metal deposition, ion implantation, or other processes can be carried out using the photoresist layer as a mask. Finally, an appropriate reagent removes (or strips) the remaining photoresist and the substrate is ready for the subsequent stage of IC fabrication or subjected to another cycle of photolithography process.

As EUVL systems become increasingly sophisticated to fabricate devices with reduced feature size, a number of challenges also arise with respect to maintaining the integrity and the efficiency of the EUVL systems during routine operation. In one example, laser-produced plasma (LPP), which generates EUV radiation within an EUV radiation source vessel, can disperse vaporized droplets of a target material (e.g., tin) throughout the interior of the vessel, leaving behind contamination that must be removed periodically. Such contamination is especially undesirable for components configured with windows for visual inspection and/or metrological analysis of the EUV radiation source. Furthermore, the process of removing the contamination often requires interruption of the generation of EUV radiation, adversely affecting the efficiency of the overall lithography exposure process. The present disclosure contemplates apparatuses and methods for monitoring and reducing target material contamination on windows of an EUV radiation source vessel.

FIG. 1 is a schematic diagram of an exemplary lithography system 100 according to some embodiments of the present disclosure. The lithography system 100 may be generically referred to as a scanner and is operable to perform lithography exposing processes with respective radiation source and exposure mode. In the present embodiment, the lithography system 100 is an EUVL system designed to expose a photoresist layer (not shown) on a semiconductor substrate 114 by EUV light (or "radiation") 136 generated by an EUV radiation source module 102. In some embodiments, the EUV light 136 has a wavelength ranging from about 1 nm to about 100 nm. In one particular example, the radiation source generates an EUV light 136 with a wavelength centered at about 13.5 nm. In the present embodiment, the lithography system 100 includes a metrology system 112 configured to monitor and inspect the LPP process.

The lithography system 100 employs an illuminator 104, which includes various refractive optic components (not shown), such as a single lens or a lens system having multiple lenses (zone plates) or alternatively, reflective optics (for EUVL system), such as a single mirror or a mirror system having multiple mirrors, in order to direct light from the radiation source module 102 onto a mask stage 106. In the present embodiment where the radiation source module 102 generates light in the EUV wavelength range, reflective optics is employed in the illuminator 104.

The lithography system 100 includes the mask stage 106 configured to secure an EUVL mask (or "mask") 108. In some embodiments, the mask stage 106 includes an electrostatic chuck (e-chuck) to secure the mask 108. In the present disclosure, the terms "mask," "photomask," and "reticle" are used interchangeably. In the depicted embodiment, the mask 108 is a reflective mask. The mask 108 may include a substrate comprising a suitable material such as a low thermal expansion material (LTEM) or fused quartz and reflective multilayers (ML) deposited on the substrate, where the ML include a plurality of film pairs, such as molybdenum-silicon (Mo/Si) or molybdenum-beryllium (Mo/Be) film pairs (e.g., a layer of molybdenum above or below a layer of silicon in each film pair) configured to be highly reflective of EUV light 136. The mask 108 may further include a capping layer, such as ruthenium (Ru), and an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 100 includes a projection optics box (POB) (or "projection optics module") 110 for imaging a pattern of the mask 108 onto the semiconductor substrate 114 secured on a substrate stage 116 of the lithography system 100. In the present embodiment, the POB comprises reflective optics for projecting the EUV light 136. The EUV light 136, which carries the image of the pattern defined on the mask 108, is directed from the mask 108 and collected by the POB 110. In various embodiments, the illuminator 104 and the POB 110 are collectively referred to as the optical module of the lithography system 100.

The lithography system 100 further includes a substrate stage 116 configured to secure a semiconductor substrate (or "substrate") 118 thereon. In many embodiments, the substrate 114 is a semiconductor wafer comprising an elementary semiconductor (e.g., silicon). The substrate 114 may alternatively or additionally include other suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), and gallium indium phosphide (GaInP). The substrate 114 may also include various features such as various doped regions, shallow trench isolation (STI) regions, source/drain features, gate stacks, dielectric features, and/or multilevel interconnects. In the present embodiment, the substrate 114 is coated with a resist layer (not shown) that is sensitive to the EUV radiation 136 generated by the radiation source module 102 of the lithography system 100.

Components of the EUV radiation source module 102 are discussed in details below with reference to FIG. 2. In many embodiments, the EUV radiation source module 102 includes a source vessel 103 in which the EUV radiation is generated. In some embodiments, interior of the source vessel 103 is maintained in a vacuum environment to prevent the EUV radiation 136 from being absorbed by ambient air. However, in the present embodiment, a stable flow of hydrogen gas may be established within the vessel without affecting the quality of the plasma produced by a target material. A laser beam 120, which may be a pulsed carbon dioxide ($CO_2$) laser beam, is produced by a laser source 118 in various embodiments. The laser beam 120 is directed by a beam delivery system comprising reflective optics 122, focused using a focus lens 124, and delivered into the source vessel 103 through an output window 126 that is integrated with a collector (also referred to as "LPP collector" or "EUV collector") 138. In some embodiments, the output window 126 comprises a suitable material substantially transparent to the laser beam 120. In the present embodiment, the collector 138 has an ellipsoidal configuration and comprises a suitable coating material or layers of coating materials such that it functions as a mirror for collecting, reflecting, and focusing the EUV radiation 136 generated by plasma 134. In some embodiments, the coating material of the collector 138 is similar to the reflective ML of the EUV mask 108. In exemplary embodiments, the coating material (not shown) of the collector 138 includes a plurality of molybdenum-silicon (Mo/Si) or molybdenum-beryllium (Mo/Be) film pairs and may further include a capping layer (e.g., Ru) coated on the ML to substantially reflect the EUV light 136. In some embodiments, the collector 138 may further include a grating structure (not shown) at its surface designed to effectively scatter the laser beam 120 directed onto the collector 138. For example, the grating structure may be a patterned silicon nitride layer coated on the collector 138.

Figure 2:
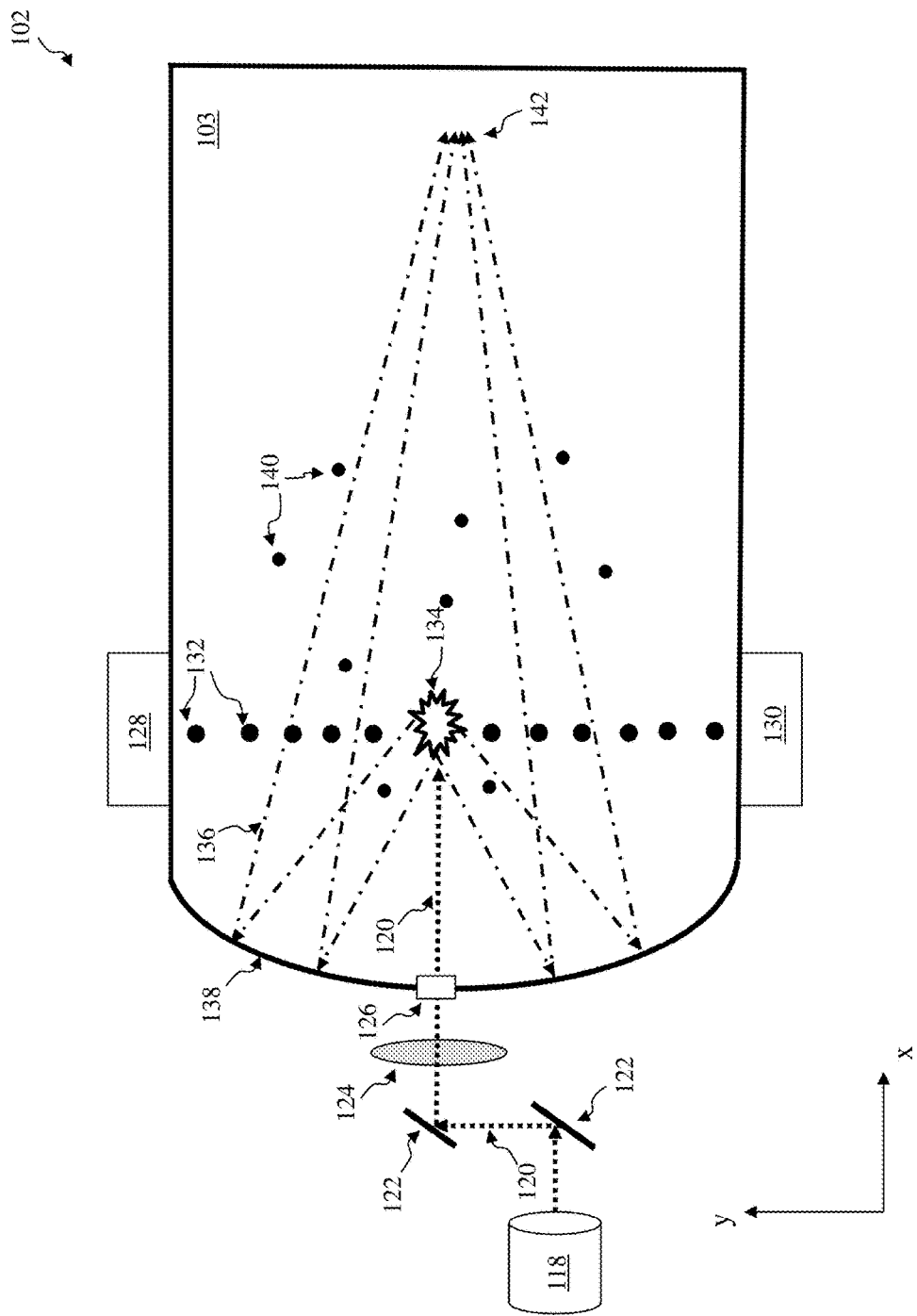
FIG. 2 is a schematic view of an EUV radiation source module in accordance with various aspects of the present disclosure.

Still referring to FIG. 2, the EUV source vessel 103 comprises a target material droplet generator 128 configured to release the target material, such as tin (Sn), in the form of droplets (hereafter referred to as the "tin droplets") 132, which are then vaporized by the laser beam 120 to generate plasma 134, thereby releasing EUV radiation 136 in the process. The EUV source vessel 103 further comprises a target material droplet collector 130 (hereafter referred to as the "tin catcher") configured to collect any tin droplets 132 not vaporized by the laser beam 120. In various embodiments, the tin catcher 130 is positioned directly below the droplet generator 128 such that the direction along which the tin droplets 132 are released and collected is perpendicular to the direction of the laser beam 120.

Though not explicitly illustrated, the EUV radiation source module 102 may include additional components. For example, the radiation source module 102 may include a central obscuration designed and configured to obscure the laser beam 120. The radiation source module 102 may also include an intermediate focus (IF)-cap module, such as an IF-cap quick-connect module configured to provide an intermediate focus 142 to the EUV radiation 136. The IF-cap module may additionally function to obscure the laser beam 120. In many embodiments, the radiation source module 102 may be further integrated or coupled with other units and/or modules.

The metrology system 112 is discussed in detail below with reference to FIG. 3, which illustrates the radiation source vessel 103 in a perspective different from that of FIG. 2. In the present embodiment, the metrology system 112 is disposed on a wall of the radiation source vessel 103. The metrology system 112 may include a plurality of monitoring units configured to inspect the LPP process. In the present embodiment, the plurality of monitoring units include camera modules 144 as well as lighting modules 146 configured to provide lighting for the camera modules 144. In some embodiments, the metrology system 112 is positioned on the wall of the source vessel 103 such that the camera modules 144 and the lighting modules 146 is each disposed over a window 148 and thus has access to the interior of the source vessel 103 through the window 148. The wall on which the metrology system 112 is positioned may include a plurality of units 155 separated by windows 148. As illustrated by a cross-sectional view in FIG. 3, each unit 155 comprises a hollow center 153 to provide space for a flow tunnel 157 (FIG. 6) to be discussed in details below. In the present embodiment, each camera and lighting module corresponds to a window 148, which is configured to have high transmittance for light in the visible range of wavelengths but have a substantially lower transmittance for the EUV radiation 136. In some embodiments, different lighting modules 146 provide visible light of different wavelengths (e.g., between about 380 nm and about 700 nm) to accommodate the operation of the camera modules 144. In one embodiment, each lighting module 146 provides light to one camera module 144. In another embodiment, multiple lighting modules 146 provide light to a single camera module 146. It is understood that the number and the configuration of the camera modules and the lighting modules are not limited herein and may be adjusted based on the extent of monitoring required by the lithography processes.

Figure 3:
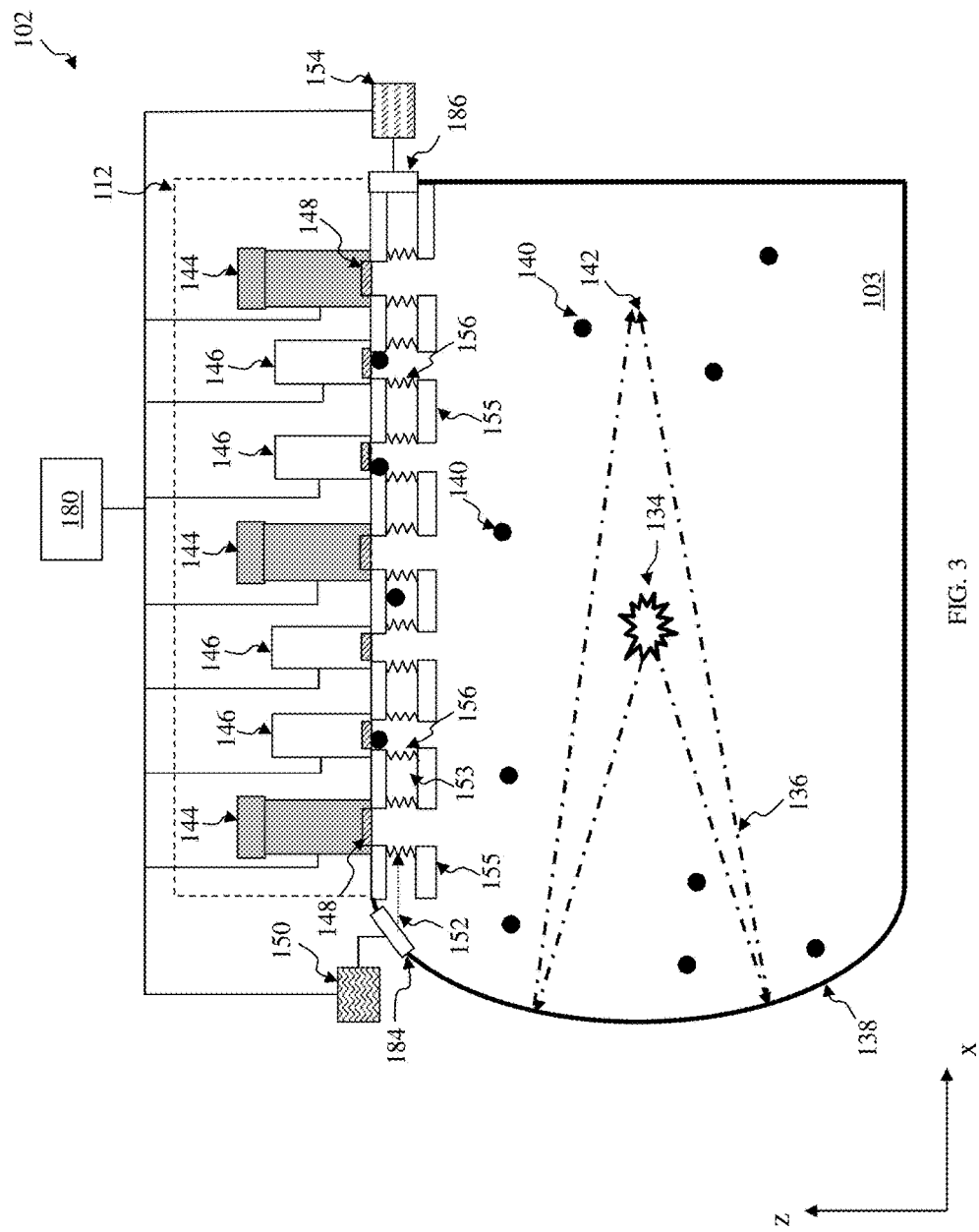
FIG. 3 is a schematic view of the EUV radiation source module of FIG. 2 illustrated in an alternative perspective in accordance with various aspects of the present disclosure.

Still referring to FIG. 3, as the EUV radiation 136 is generated by the plasma 134, tin contamination in the form of vaporized particles (hereafter referred to as "tin contamination particles") 140 are dispersed throughout the interior of the source vessel 103. In many embodiments, the tin contamination particles 140 adsorb onto various surfaces of the source vessel 103, including the interior surface of the windows 148, forming contaminant that requires cleaning in order to maintain the proper operation of the metrology system 112. Generally, the windows 148 are periodically inspected manually in order to determine the extent of tin contamination. If a level of contamination is above a predetermined threshold, the lithography exposing processes are halted in order to decontaminate the windows 148. Accordingly, such methods of inspecting and removing tin contamination may adversely impact the operational efficiency of the EUVL system 100. The present disclosure provides an apparatus configured to monitor and remove tin particle contamination on the windows 148 of the metrology system 112.

In some embodiments, the apparatus comprises an optical sensing module configured to monitor tin contamination on the windows 148. In the present embodiment, the optical sensing module is embedded within one or more of the camera module 144 and/or the lighting module 146. Though an exemplary camera module 144 is employed to describe the optical sensing module below, the present disclosure is not limited herein.

As seen in FIG. 4, the camera module 144 comprises two portions: a top portion 162 and a shaft 164. In various embodiments, the top portion 162 of the camera module 144 comprises suitable components configured to capture images and subsequently transmit them for further analysis. The shaft 164, as shown in FIG. 5 in a cross-sectional depiction of FIG. 4, comprises hollow space in the center whose width (i.e., diameter) is aligned with that of the window 148 to facilitate the operation of the camera module 144.

Still referring to FIG. 5, components of the optical sensing module including a light-emitting diode (LED) 166, a photodetector 168, and, in some embodiments, an optical diaphragm 170, are embedded within the shaft 164. In many embodiments, the LED 166 and the photodetector 168 are configured in such a way that light (or "radiation") 172 emitted from the LED 166 illuminates and optically interacts with the window 148, and is subsequently detected by the photodetector 168 after being directed from the window 148. In various embodiments, the radiation 172 emitted from the LED 166 comprises light in the infrared (IR) wavelength (e.g., between about 700 nm and about 1 mm), making the LED 166 an IR-LED in many embodiments. Accordingly, intensity detected by the photodetector 168 includes a reflected component 174 and a refracted component 176 of the radiation 172 by the window 148. In some examples, the photodetector 168 measures at least the intensity of the refracted component 176. In some embodiments, the optical sensing module includes an array of photodetectors 168 configured along the height of the shaft 164, such that a greater area of detection can be made available for the radiation directed from the window 148.

In various embodiments, the optical sensing module further comprises an optical diaphragm 170 positioned over the photodetector 168 and configured to filter the radiation directed from the window 148. In the present embodiment, the optical diaphragm 170 is operable to allow radiation in the IR wavelength to pass through but prevent radiation of other wavelengths from interfering signals detected by the photodetector 168. In some embodiments, the optical diaphragm 170 is configured to protect the photodetector 168 from being damaged by radiation having shorter wavelengths than the IR radiation. In an exemplary embodiment, the optical diaphragm 170 has a substantially higher transmittance for IR radiation and a substantially lower transmittance for EUV radiation than the window 148. In another exemplary embodiment, the optical diaphragm 170 has a substantially higher transmittance for IR radiation and a substantially lower transmittance for visible light than the window 148. Examples of materials that can be used for constructing the diaphragm 170 include, but are not limited to, silicon, germanium, fused silica, sapphire, zinc selenide, potassium bromide, calcium fluoride, magnesium fluoride, and sodium chloride. In some embodiments, the optical diaphragm 170 is an optical lens, such as a convex lens.

In some embodiments, for each optical sensing module, a baseline intensity of the IR radiation corresponding to a substantially uncontaminated (i.e., substantially tin-free) window 148 is established in an initial operation of the optical sensing module. This baseline intensity may be established by, for example, providing radiation 172 (e.g., IR radiation) emitted from the LED 166 to the substantially uncontaminated window 148, measuring the total intensity arising from both a reflected component 174 and a refracted component 176 of the radiation directed from the window 148, and storing the baseline intensity in a database. Subsequently, any intensity measured by the photodetector 168 when the EUV radiation source module 102 is in operation is compared to the baseline intensity acquired for that optical sensing module and is used to determine the level of tin contamination present on the window 148. Specifically, still referring to FIG. 5, when tin contamination particles 140 adsorb onto a surface 182 of the window 148 facing the interior of the source vessel 103, the intensity of the refracted component 176 of the radiation 172 decreases due to the interaction between the radiation and any tin contamination particles 140 while the intensity of the reflected component 174 off the opposite surface 178 remains substantially unaffected, leading to a reduction in the overall intensity measured by the photodetector 168.

Figure 6:
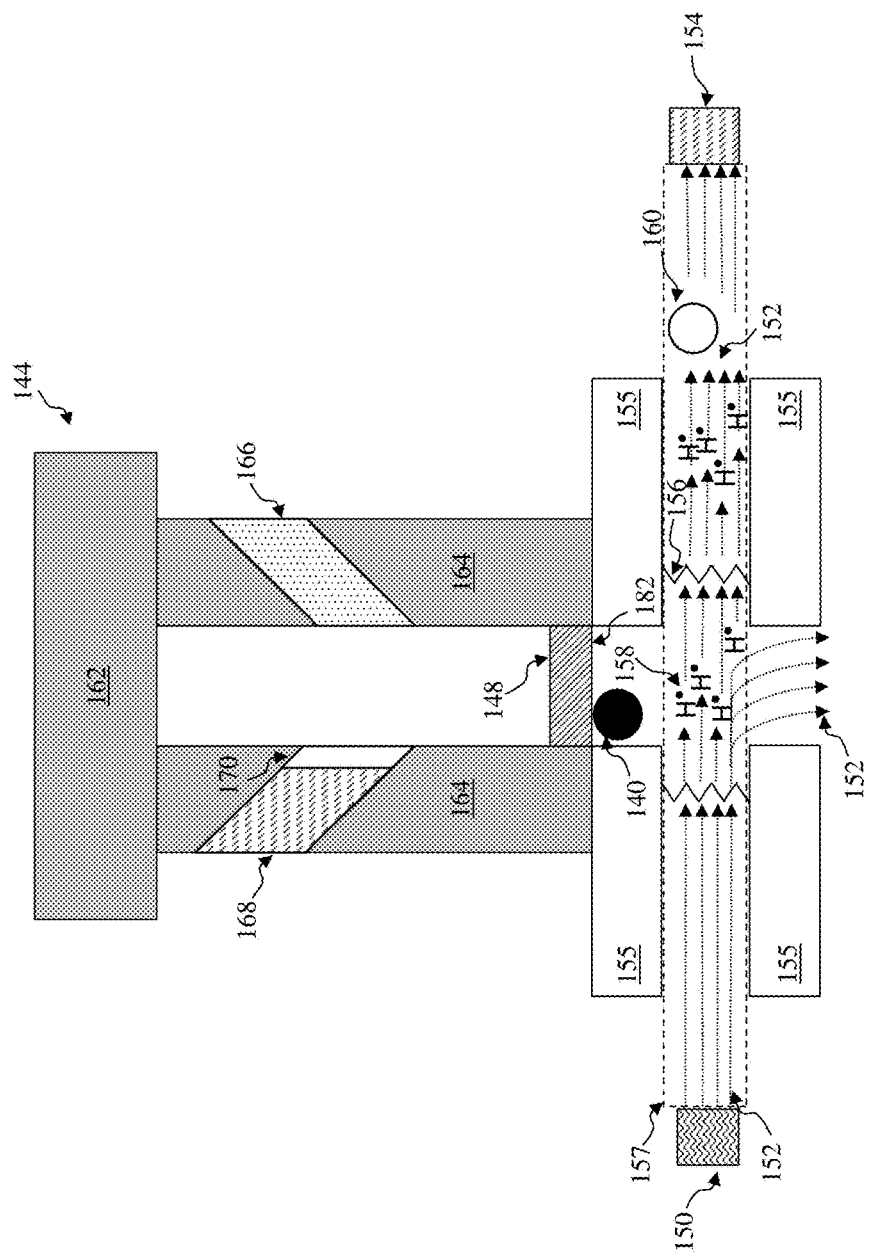
FIG. 6 illustrates a cross-sectional view of the portion of the EUV radiation source module of FIG. 4 taken along line AA' in accordance with various aspects of the present disclosure.

Referring back to FIG. 3, the apparatus configured to monitor and remove tin contamination further comprises a hydrogen gas supply module 150 and a gas removal module 154 working in conjunction with heating elements 156 operable to heat hydrogen gas 152 provided by the hydrogen gas supply module 150. In some embodiments, the hydrogen gas supply module 150 is configured to pump hydrogen gas 152 into the source vessel 103 via an inlet 184 and is positioned such that a substantial amount of the hydrogen gas 152 is provided to an interior surface (i.e., the surface 182) of each window 148. It is understood, however, that the hydrogen gas 152 can also diffuse into other parts of the source vessel 103 (FIG. 6). In an exemplary embodiment, the hydrogen gas supply module 150 comprises at least a hydrogen source (e.g., a hydrogen gas tank; not shown) and other suitable equipment (e.g., gas lines) configured to deliver the hydrogen gas from the hydrogen gas source to the radiation source vessel 103 via the inlet 184.

Referring to FIG. 6, which is an enlarged view of a portion of the radiation source module 102, the hydrogen gas supply module 150 is configured to provide a flow of hydrogen gas 152 substantially in the flow tunnel (i.e., a passage for the hydrogen gas 152) 157 of the interior surface 182 of the window 148. In some embodiments, the hydrogen gas supply module 150 is configured to provide hydrogen gas 152 in a continuous flow. In other embodiments, the hydrogen gas supply module 150 can be programmed to provide hydrogen gas 150 only when a decontamination process is implemented. In the present embodiment, the flow rate of the hydrogen gas 152 may be between about 30 slm and about 55 slm, where "slm" denotes "standard liter per minute."

In the present embodiment, the heating elements 156 are positioned across the flow tunnel 157 and configured to heat the hydrogen gas 152 as it passes through. In the present embodiment, each heating element 156 is mounted across the hollow space 153 of each wall unit 155 and operable to provide temperatures up to about 1500 degrees Celsius. The heating elements 156 may be in any suitable configuration such as, for example, a filament or a coil, and may comprise any suitable high-temperature material, such as tungsten.

Still referring to FIG. 6, when the hydrogen gas 152 is heated to an elevated temperature, the hydrogen gas 152 forms atomic hydrogen 158, also known as hydrogen radicals (H.), which react with tin contamination particles 140 adsorbed onto the window 148 to form a gaseous compound tin hydride ($SnH_4$) 160. In many embodiments, the tin hydride 160 may be removed by the gas removal module 154, which continuously pumps out any gaseous species, such as the tin hydride 160, from the source vessel 103. In an exemplary embodiment, the gas removal module 150 comprises a vacuum pump (not shown) operable to remove any gaseous species, including the tin hydride 160, via an outlet 186 (FIG. 3). In the present embodiment, the gas removal module 154 may be configured to operate simultaneously with the hydrogen gas supply 150. The gas removal module 154 may be controlled by the control module 180, though the present disclosure is not limited herein.

In the present embodiment, referring back to FIG. 3, the apparatus comprising the optical sensing module, the hydrogen gas supply module 150, the heating elements 156, and optionally the gas removal module 154 are coupled together to a control module 180 operating on a feedback mechanism. In the present embodiment, the control module 180 maintains a database of the baseline intensity of the radiation (e.g., IR radiation) of each optical sensing module and is operable to compare intensity measured by the photodetector 168 with the baseline intensity of that module. In the present embodiment, the control module 180 is configured to control the operation of the heating elements 156 and the hydrogen gas supply module 150 simultaneously.

Figure 7:
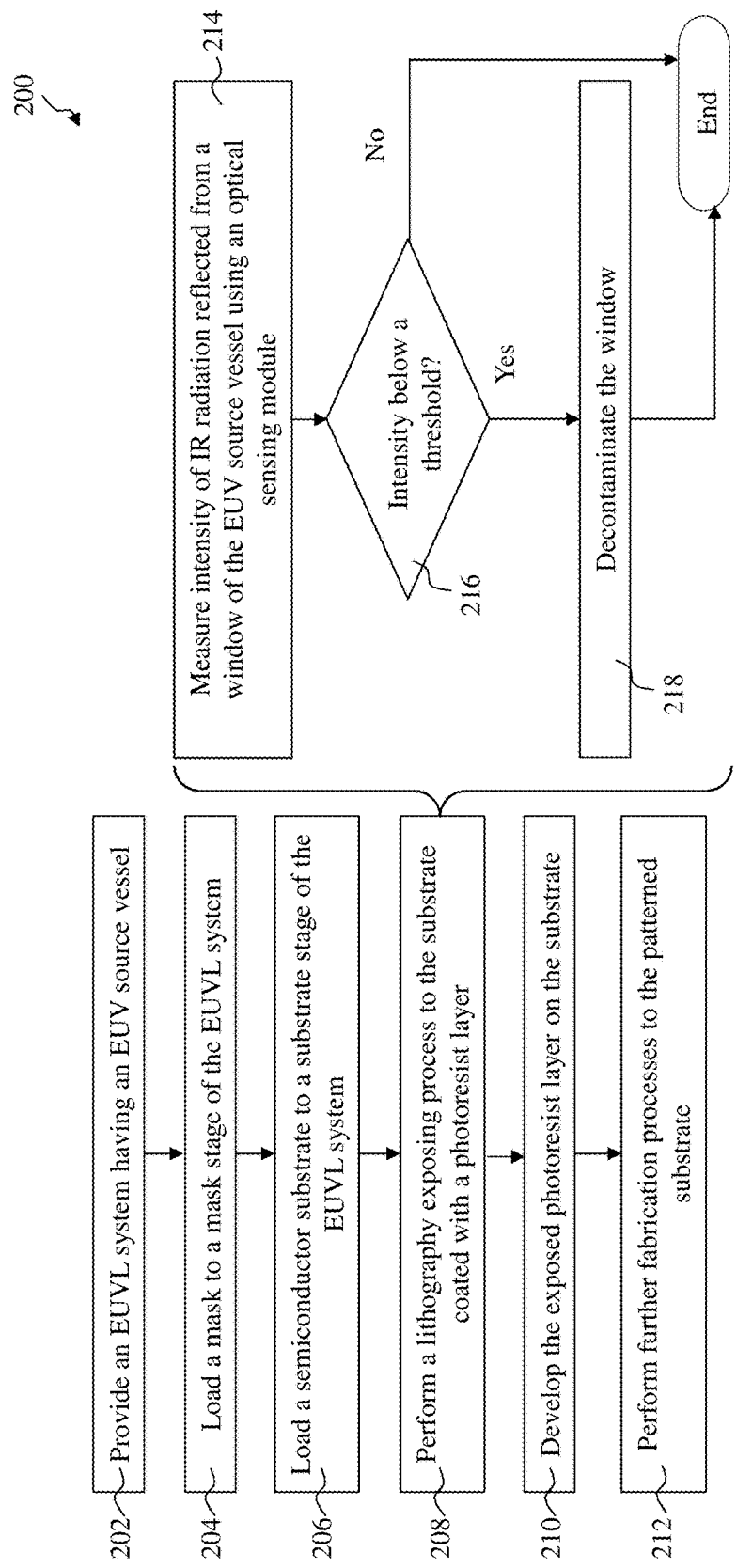
FIG. 7 is a flowchart of a method in accordance with various aspects of the present disclosure.

FIG. 7 is a flowchart of an exemplary method 200 constructed according to various embodiments of the present disclosure. The method 200 is merely an example and is thus not intended to limit the present disclosure beyond what is explicitly recited in the claims. Additional steps can be provided before, during, and after the processing methods provided herein, and some of the steps described can be replaced, eliminated, or moved around for additional embodiments of the present disclosure.

At operation 202, the method 200 provides an EUVL system, such as the exemplary EUVL system 100 described herein. In many embodiments, the EUVL system 100 includes the substrate stage 116 configured to secure the semiconductor substrate 114 with an electrostatic chuck (not shown), the mask stage 106 configured to secure the EUVL mask 108, and the optics (e.g., illuminators 104 and the POB 110) configured to direct EUV radiation to the semiconductor substrate 114. The EUVL system 100 also comprises the EUVL radiation source module 102 that includes the window 148, the tin droplet generator 128, the tin catcher 130, the collector 138, the hydrogen gas supply module 150, the heating elements 156, and the gas removal module 154. In the present embodiment, the EUVL system 100 further comprises a monitoring unit 144 and/or 146 configured to monitor the EUVL radiation source through the window 148, an optical sensing module embedded in the monitoring unit 144 and/or 146 that includes the IR-LED 166 and the photodetector 168, and a control module 180 coupling together and operable to control the optical sensing module, the hydrogen gas supply module 150, the heating elements 156, and the gas removal module 154. Details of each component of the EUVL system 100 have been discussed above.

Thereafter, at operation 204, the method 200 provides the mask 108 to the mask stage 106 of the lithography system 100. In many embodiments, the mask 108 includes an IC pattern to be transferred to a semiconductor substrate (e.g., the substrate 114). The operation 202 may include additional steps, such as securing the mask 108 to the mask stage 106 and subsequently performing an alignment.

At operation 206, the method 200 provides the substrate 114 to the substrate stage 116 of the lithography system 100. In the present embodiment, the substrate 114 is a semiconductor wafer, such as a silicon wafer or other type of wafer, to be patterned.

At operation 208, the method 200 performs a lithography exposing process to the substrate 114 coated with the photoresist layer (not shown). In the present embodiment, the EUV radiation source module 102 utilizes laser-produced plasma (LPP), e.g., plasma 134, to generate the EUV radiation 136 for the exposing process. Referring back to FIG. 2, after entering the radiation source vessel 103, the laser beam 120 vaporizes the tin droplets 132 released from the droplet generator 128 and subsequently generates the plasma 134, which then produces the EUV radiation 136. In some embodiments, the EUV radiation 136 thus generated is collected by and reflected from the collector 138 and is subsequently focused at the intermediate focus 142 provided by the intermediate-focus cap module (not shown). In mane embodiments, generating the plasma 134 also disperses a plurality of tin contamination particles 140, which then adsorb onto various surface of the radiation source vessel 103 (see FIG. 3). The metrology system 112 that includes a plurality of monitoring units such as the camera module 144 and the light module 146 may be configured to monitor various parameters involved in the generation of the EUV radiation 136 during the lithography exposing process at operation 208.

In some embodiments, the laser beam 120 may be pulsed. As such, the pulse frequency of the laser beam 120 and the frequency at which the tin droplets 132 are released by the droplet generator 128 may be synchronized such that the tin droplets 132 are vaporized by the laser beam 120 at a consistent peak power. In some examples, the frequency at which the tin droplets 132 are generated ranges from about 20 kHz to about 100 kHz. In one example, the laser source 118 includes a laser circuit module (not shown) designed to control the frequency of the laser pulses. The laser circuit module and the tin droplet generator 128 can be coupled to synchronize the generation of the pulsed laser beam 120 and the tin droplets 132.

Thereafter, the focused EUV radiation 136 exits the radiation source vessel 103 and is directed by the illuminator 104 onto the mask 108 secured on the mask stage 106. Subsequently, the EUV radiation 136 is projected onto (i.e., exposing) the photoresist layer (not shown) coated on the substrate 114, thereby forming on the substrate 114 a latent image of the pattern of the mask 108. In the present embodiment, the lithography exposing process is implemented in a scan mode.

At operation 210, the method 200 develops the exposed photoresist layer on the substrate 144. In one example, the photoresist layer is a positive-tone photoresist such that exposed portion(s) of the photoresist layer is removed by a developing solution. In another example, the photoresist layer is a negative-tone photoresist such that unexposed portion(s) of the photoresist layer is removed by the developing solution. In yet another example, the photoresist layer is positive-tone and the developing solution is negative-tone such that the exposed portion(s) of the photoresist layer remains, while unexposed portion(s) is removed by the developing solution. In many embodiments, to complete the operation 210, the substrate 114 is transferred out of the lithography system 100 to a developing unit (not shown) following the operation 208.

The method 200 may further include other operations, such as various baking steps. As an example, the method 200 may perform a post-exposure baking (PEB) process following the operation 208 but before the operation 210.

At operation 212, the method 200 performs additional fabrication processes to the substrate 114. In one example, the fabrication process may be an etching process applied to the substrate 114 or a material layer (not shown) on the substrate 114 using the patterned photoresist layer as an etch mask. In another example, the fabrication process may be an ion implantation process applied to the substrate 114 using the patterned photoresist layer as an implantation mask. In many embodiments, following the operation 210, the patterned photoresist layer may be removed by a process such as, for example, wet stripping or by plasma ashing.

In the present embodiment, concurrent to performing the lithography exposing process at operation 208, the method 200 implements an operation 214. In particular, the method 200 at the operation 212 measures the intensity of the radiation 172 emitted by the ILED 166 and subsequently directed by the window 148. In the depicted embodiment, the radiation 172 has wavelengths in the infrared, or IR, range. As illustrated in FIG. 5, the radiation 172 emitted by the LED 166 illuminates the window 148 and optically interacts with the photodetector 168. In many embodiments, the intensity measured by the photodetector 168 is attributed to the intensity of both the reflected component 174 and the refracted component 176 of the radiation 172. The reflected component 174 may be attributed to the interaction between the radiation 172 and the surface 178, while the refracted component 176 may be attributed to the interaction between the radiation 172 and the surface 182.

In the present embodiment, tin contamination particles 140 adsorbed onto the window 148 (as exemplified in FIGS. 4 and 5) can be substantially detected by the photodetector 168. Specifically, adsorbed tin contamination particles 140 interfere with the radiation 172 refracted by the window 148, thereby decreasing the intensity of the refractive component 176 of the radiation 172. In an exemplary embodiment, the tin contamination particles 140 may absorb a portion of the radiation 172. In another exemplary embodiment, the tin contamination particles 140 may scatter a portion of the radiation 172. Since the reflective component 174 is largely unaffected by the adsorbed tin contamination particles 140, the total intensity measured by the photodetector 168, which takes into account the sum of the reflective component 174 and the refractive component 176, likewise decreases. In other words, the intensity of the radiation measured by the photodetector 168 is inversely proportional to amount of contamination accumulated on the window 148. In the present embodiment, the measured intensity is acquired and subsequently processed by the control module 180.

At operation 216, the method 200 compares the measured intensity with the baseline intensity of the same optical sensing module established for a substantially uncontaminated (i.e., substantially tin-free) window 148. In some embodiments, the comparison between the measured intensity and the baseline intensity is quantified by a threshold percentage below which a decontamination process is initiated. In various embodiments, the threshold percentage is between about 90% to about 95% of the baseline intensity. It is understood that the threshold percentage may be any suitable percentage, with a higher percentage leading to more frequent implementation of decontamination.

At operation 218, the method 200 decontaminates the window 148. Specifically, based on the result of comparing the measured intensity and the baseline intensity, the control module 180 executes commands to increase the temperature of the heating elements 156 and the flow rate of the hydrogen gas 152 to implement the decontamination process.

In many embodiments, the hydrogen gas supply module 150 continuously provides hydrogen gas 152 at a steady flow rate even when the decontamination process is not implemented. However, when the decontamination process is initiated, the process module 180 increases the flow rate of the hydrogen gas 152 to provide a significantly greater amount of hydrogen gas 152 to the interior surface 182 of the windows 148. In one example, the flow rate of hydrogen gas 152 when decontamination is not implemented is between about 25 slm and about 30 slm, while the flow rate of hydrogen gas 152 when decontamination is implemented is between about 50 slm and about 55 slm, with greater flow rate leading to a higher rate of decontamination.

In other embodiments, the hydrogen gas supply module 150 does not provide any hydrogen gas when the decontamination process is not implemented. As such, when an intensity level below the threshold percentage of the baseline intensity is detected, the control module 180 initiates the operation of the hydrogen gas supply module 150 and increases the flow rate to between about 50 slm and about 55 slm.

During the operation 218, when hydrogen gas 152 is heated by the heating elements 156 to above approximately 300 degrees Celsius, hydrogen gas molecules $H_2$ dissociate into hydrogen radicals (H') 158. As shown in FIG. 6, the hydrogen radicals 158 react with the tin contamination particles 140 adsorbed onto the window 148 to form the gaseous compound tin hydride $SnH_4$ (or "stannane") 160. In various embodiments, increasing the temperature of the heating elements 156 to above approximately 300 degrees Celsius increases the rate at which the tin hydride 160 is formed. In an exemplary embodiment, the temperature of the heating elements 156 is elevated to about 1500 degrees Celsius during the decontamination process at operation 218. In many embodiments, a higher temperature may lead to an accelerated reaction rate of converting the hydrogen gas 152 to hydrogen radicals 158. In an exemplary embodiment, the reaction rate increases exponentially as the temperature of the heating elements 156 increases. The tin hydride 160 can then be removed from the radiation source vessel 103 by the gas removal module 154 via the outlet 186. In some embodiments, during the decontamination process, the hydrogen gas supply module 150, the heating elements 156, and the gas removal module 154 are operated simultaneously.

Although not limiting, one or more embodiments of the present disclosure offer improvements for semiconductor devices and methods of fabricating the same. For example, embodiments of the present disclosure provide an apparatus for monitoring and removing tin contamination adsorbed onto windows of an EUVL radiation source vessel. In particular, the apparatus provided herein employs an optical sensing module configured to use IR radiation, to determine level of tin particle contamination affecting the windows. When the level of tin contamination reaches a pre-determined threshold, a feedback mechanism built-in the apparatus initiates a decontamination process, which employs a series of heating elements working in conjunction of hydrogen gas to convert tin to tin hydride, a gaseous compound that can be readily removed by a gas removal module that is also incorporated into the apparatus. Advantageously, the apparatus and the method of using the same described in the present disclosure make possible a streamlined, uninterrupted process to detect and decontaminate windows of an EUV source vessel without relying on the EUV radiation generated in the source vessel.

Accordingly, the present disclosure provides many different embodiments for fabricating a semiconductor device. In one aspect, the present disclosure provides an apparatus including an extreme ultraviolet (EUV) radiation source module operable to generate EUV radiation through a laser-produced-plasma (LPP) process, a monitoring unit configured to inspect the EUV radiation source through a window, an optical sensing module embedded in the monitoring unit, a hydrogen gas supply module configured to provide hydrogen gas to the first window, and heating elements configured to heat the hydrogen gas. In some embodiments, the optical sensing module includes an infrared light-emitting diode (IR-LED) and a photodetector, which is configured to measure IR radiation emitted by the IR-LED and directed by the window.

In some embodiments, the monitoring unit is a camera module configured on a wall of the EUV radiation source module.

In some embodiments, the apparatus also includes an additional monitoring unit and an additional optical sensing module embedded in the additional monitoring unit, the additional monitoring unit being operable to provide lighting for the first monitoring unit through another corresponding window.

In some embodiments, the optical sensing module further includes an optical diaphragm disposed over the photodetector, where the optical diaphragm has a substantially lower transmittance for the EUV radiation and a substantially higher transmittance for the IR radiation than the first window.

In some embodiments, the optical sensing module, the hydrogen gas supply module, and the heating elements are coupled to a control module that is configured to compare the intensity of the IR radiation measured by the optical sensing module with a baseline intensity, and further configured to adjust settings of the hydrogen gas supply module and the heating elements when the intensity of the IR radiation falls below a threshold percentage of the baseline intensity.

In some embodiments, the IR-LED and the photodetector are configured such that the IR radiation emitted from the IR-LED and directed by the window includes a reflected component by a first surface of the window and a refracted component by a second surface opposite to the first surface of the window, and wherein an intensity of the IR radiation measured by the photodetector includes at least the intensity of the refracted component.

In some embodiments, the hydrogen gas supply module is operable to provide a continuous flow of the hydrogen gas through an inlet configured on the EUV radiation source module. In further embodiments, the heating elements are configured to heat the hydrogen gas as it flows over the window.

In another aspect, the present disclosure provides an apparatus including a substrate stage configured to secure a semiconductor substrate, a mask stage configured to secure an extreme ultraviolet lithography (EUVL) mask, an EUVL radiation source module, which includes a window, a tin droplet generator, a tin catcher, and a collector, a camera module disposed over the window, an optical sensing module embedded in the camera module, the optical sensing module including an infrared light-emitting diode (IR-LED) and a photodetector, which is configured to receive IR radiation emitted by the IR-LED and directed by the window, and optics configured to image a pattern of the EUVL mask onto the semiconductor substrate.

In some embodiments, the optical sensing module also includes an optical diaphragm disposed over the photodetector, the optical diaphragm having a substantially higher transmittance for the IR radiation and a substantially lower transmittance for EUV radiation than the window. In further embodiments, the optical diaphragm includes a material selected from silicon, germanium, fused silica, sapphire, zinc selenide, potassium bromide, calcium fluoride, magnesium fluoride, or sodium chloride.

In some embodiments, the IR-LED and the photodetector are configured such that the intensity of the IR radiation received by the photodetector has a reflected component by an exterior surface of the window and a refracted component by the interior surface of the window.

In some embodiments, the apparatus also includes a hydrogen gas supply module configured to provide hydrogen gas to an interior surface of the window, heating elements configured to heat hydrogen gas provided by the hydrogen gas supply module, and a gas removal module. In some embodiments, the hydrogen gas supply module is operable to provide a continuous flow of the hydrogen gas through an inlet configured on the EUV radiation source module. In further embodiments, the heating elements are configured to heat the hydrogen gas as it flows over the window.

In some embodiments, the apparatus further includes a control module coupling together the optical sensing module, the hydrogen gas supply module, and the heating elements. In some embodiments, the control module is configured to compare the intensity of the IR radiation received by the optical sensing module with a baseline intensity, and further configured to increases flow rate of the hydrogen gas and temperature of the heating elements if the intensity of the IR radiation falls below a threshold.

In yet another aspect, the present disclosure provides a method including providing an EUVL system, loading a mask to the mask stage, loading a semiconductor substrate to the substrate stage, performing a lithography exposing process to the semiconductor substrate coated with a photoresist layer, concurrent to performing the lithography exposing process, measuring intensity of IR radiation using the optical sensing module, and subsequent to measuring the intensity of the IR radiation, if the measured intensity is below a threshold, decontaminating the window by heating the hydrogen gas with the heating elements.

In some embodiments, the EUVL system includes a substrate stage, a mask stage, an EUVL radiation source module, a monitoring unit configured to monitor the EUV radiation source through the window, an optical sensing module embedded in the monitoring unit, the optical sensing module including an infrared light-emitting diode (IR-LED) and a photodetector, a control module operable to control the optical sensing module, the hydrogen gas supply module, and the heating elements, and optics configured to direct EUV radiation onto the substrate stage. In further embodiments, the EUVL radiation source module includes a window, a tin droplet generator, a tin catcher, a collector, a hydrogen gas supply module operable to provide hydrogen gas to the window, heating elements configured to heat the hydrogen gas provided to the window, and a gas removal module.

In some embodiments, performing the lithography exposing process generates tin contamination that subsequently adsorb onto the window. In some embodiments, measuring the intensity of the IR radiation includes illuminating the window with the IR radiation emitted from the IR-LED, measuring the intensity of the IR radiation with the photodetector, and comparing the measured intensity with a baseline intensity stored in the control module, where the threshold is a percentage of the baseline intensity.

In some embodiments, decontaminating the window comprises operating the gas removal module simultaneously while heating the hydrogen gas with the heating elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   an extreme ultraviolet (EUV) radiation source module operable to generate EUV radiation through a laser-produced-plasma (LPP) process;
   a first monitoring unit configured to inspect the EUV radiation source through a first window;
   a first optical sensing module embedded in the first monitoring unit, the first optical sensing module comprising an infrared light-emitting diode (IR-LED) and a photodetector, wherein the photodetector is configured to measure IR radiation emitted by the IR-LED and directed by the first window;
   a hydrogen gas supply module configured to provide hydrogen gas to the first window; and
   heating elements configured to heat the hydrogen gas.

2. The apparatus of claim 1, wherein the first monitoring unit is a camera module configured on a wall of the EUV radiation source module.

3. The apparatus of claim 2, further comprising a second monitoring unit and a second optical sensing module embedded in the second monitoring unit, the second monitoring unit being operable to provide lighting for the first monitoring unit through a second window.

4. The apparatus of claim 1, wherein the first optical sensing module further comprises an optical diaphragm disposed over the photodetector, the optical diaphragm having a substantially lower transmittance for the EUV radiation and a substantially higher transmittance for the IR radiation than the first window.

5. The apparatus of claim 1, wherein the first optical sensing module, the hydrogen gas supply module, and the heating elements are coupled to a control module, the control module being configured to compare intensity of the IR radiation measured by the first optical sensing module with a baseline intensity, and further configured to adjust settings of the hydrogen gas supply module and the heating elements when the intensity of the IR radiation falls below a threshold percentage of the baseline intensity.

6. The apparatus of claim 1, wherein the IR-LED and the photodetector are configured such that the IR radiation emitted from the IR-LED and directed by the first window includes a reflected component by a first surface of the first window and a refracted component by a second surface opposite to the first surface of the first window, and wherein an intensity of the IR radiation measured by the photodetector includes at least the intensity of the refracted component.

7. The apparatus of claim 1, wherein the hydrogen gas supply module is operable to provide a continuous flow of the hydrogen gas through an inlet configured on the EUV radiation source module.

8. The apparatus of claim 7, wherein the heating elements are configured to heat the hydrogen gas as it flows over the first window.

9. An apparatus, comprising:
a substrate stage configured to secure a semiconductor substrate;
a mask stage configured to secure an extreme ultraviolet lithography (EUVL) mask;
an EUVL radiation source module comprising a window, a tin droplet generator, a tin catcher, and a collector;
a camera module disposed over the window;
an optical sensing module embedded in the camera module, the optical sensing module comprising an infrared light-emitting diode (IR-LED) and a photodetector, wherein the photodetector is configured to receive IR radiation emitted by the IR-LED and directed by the window; and
optics configured to image a pattern of the EUVL mask onto the semiconductor substrate.

10. The apparatus of claim 9, wherein the optical sensing module further comprises an optical diaphragm disposed over the photodetector, the optical diaphragm having a substantially higher transmittance for the IR radiation and a substantially lower transmittance for EUV radiation than the window.

11. The apparatus of claim 10, wherein the optical diaphragm comprises a material selected from silicon, germanium, fused silica, sapphire, zinc selenide, potassium bromide, calcium fluoride, magnesium fluoride, or sodium chloride.

12. The apparatus of claim 9, wherein the IR-LED and the photodetector are configured such that intensity of the IR radiation received by the photodetector has a reflected component by an exterior surface of the window and a refracted component by an interior surface of the window.

13. The apparatus of claim 9, further comprising a hydrogen gas supply module configured to provide hydrogen gas to an interior surface of the window, heating elements configured to heat hydrogen gas provided by the hydrogen gas supply module, and a gas removal module.

14. The apparatus of claim 13, wherein the hydrogen gas supply module is operable to provide a continuous flow of the hydrogen gas through an inlet configured on the EUV radiation source module.

15. The apparatus of claim 14, wherein the heating elements are configured to heat the hydrogen gas as it flows over the window.

16. The apparatus of claim 13, further comprising a control module coupling together the optical sensing module, the hydrogen gas supply module, and the heating elements, wherein the control module is configured to compare intensity of the IR radiation received by the optical sensing module with a baseline intensity, and further configured to increases flow rate of the hydrogen gas and temperature of the heating elements if the intensity of the IR radiation falls below a threshold.

17. A method, comprising:
providing an extreme ultraviolet lithography (EUVL) system comprising:
a monitoring unit configured to monitor an EUV radiation source through a window configured on an EUVL radiation source module;
an optical sensing module embedded in the monitoring unit, the optical sensing module comprising an infrared light-emitting diode (IR-LED) and a photodetector;
a decontaminating unit including a hydrogen gas supply module operable to provide hydrogen gas to the window, heating elements configured to heat the hydrogen gas provided to the window, and a gas removal module;
a control module operable to control the optical sensing module, the hydrogen gas supply module, and the heating elements; and
optics configured to direct EUV radiation onto a substrate stage;
performing a lithography exposing process to a semiconductor substrate provided on the substrate stage;
concurrent to performing the lithography exposing process, measuring intensity of IR radiation using the optical sensing module; and
subsequent to measuring the intensity of the IR radiation, if the intensity is below a threshold, decontaminating the window by heating the hydrogen gas with the heating elements.

18. The method of claim 17, wherein performing the lithography exposing process generates tin contamination that subsequently adsorb onto the window.

19. The method of claim 17, wherein measuring the intensity of the IR radiation comprises:
illuminating the window with the IR radiation emitted from the IR-LED;
measuring the intensity of the IR radiation with the photodetector; and
comparing the intensity with a baseline intensity stored in the control module, wherein the threshold is a percentage of the baseline intensity.

20. The method of claim 17, wherein decontaminating the window comprises operating the gas removal module simultaneously while heating the hydrogen gas with the heating elements.

* * * * *